United States Patent
Takamuku et al.

(10) Patent No.: US 12,028,109 B2
(45) Date of Patent: Jul. 2, 2024

(54) ADAPTIVE EQUALIZER, EQUALIZATION METHOD, AND OPTICAL COMMUNICATION SYSTEM

(71) Applicant: NTT Innovative Devices Corporation, Yokohama (JP)

(72) Inventors: Tomohiro Takamuku, Kanagawa (JP); Mitsuteru Yoshida, Kanagawa (JP); Tomoharu Semboku, Kanagawa (JP); Tsutomu Takeya, Kanagawa (JP)

(73) Assignee: NTT Innovative Devices Corporation, Yokohama (JP)

( * ) Notice: Subject to any disclaimer, the term of this patent is extended or adjusted under 35 U.S.C. 154(b) by 0 days.

(21) Appl. No.: 17/920,832

(22) PCT Filed: May 19, 2021

(86) PCT No.: PCT/JP2021/019010
§ 371 (c)(1),
(2) Date: Oct. 24, 2022

(87) PCT Pub. No.: WO2021/241362
PCT Pub. Date: Dec. 2, 2021

(65) Prior Publication Data
US 2023/0170994 A1 Jun. 1, 2023

(30) Foreign Application Priority Data
May 28, 2020 (JP) .................. 2020-093039

(51) Int. Cl.
*H04B 10/61* (2013.01)
*H04B 3/06* (2006.01)
*H04B 10/2569* (2013.01)

(52) U.S. Cl.
CPC .......... *H04B 10/2569* (2013.01); *H04B 3/06* (2013.01); *H04B 10/6162* (2013.01)

(58) Field of Classification Search
None
See application file for complete search history.

(56) References Cited

U.S. PATENT DOCUMENTS 8,693,898 B2 * 4/2014 Koizumi .............. H04B 10/613
398/208
8,977,141 B2 * 3/2015 Horikoshi ......... H04L 25/03261
398/208

(Continued)

FOREIGN PATENT DOCUMENTS

JP 2010-118817 A 5/2010
JP 2018-182620 A 11/2018

OTHER PUBLICATIONS

International Search Report and Written Opinion of the International Searching Authority issued by the Japan Patent Office for corresponding International Patent Application No. PCT/JP2021/019010, mailed on Jul. 27, 2021, with a partial English translation.

*Primary Examiner* — Jai M Lee
(74) *Attorney, Agent, or Firm* — Myers Wolin, LLC

(57) ABSTRACT

A tap-coefficient control circuit sets the tap coefficient converged by the second tap coefficient updater as an initial value of the tap coefficient in the first digital filter which is to be updated by the first tap coefficient updater, arranges the tap coefficients converged by the second tap coefficient updater in descending order of contribution degree to the convergence operation of tap coefficient update in the first tap coefficient updater, judges the tap coefficient not less than upper specified number to be valid and the tap coefficient less than the specified number to be invalid, and sets the tap coefficient of the first digital filter corresponding to the tap coefficient judged to be invalid to zero not to be used in a calculation of the first tap coefficient updater until a next judgment result is made.

10 Claims, 10 Drawing Sheets

(56) References Cited

U.S. PATENT DOCUMENTS

| | | | | |
|---|---|---|---|---|
| 9,037,004 | B2* | 5/2015 | Ogasahara | H04J 14/06 |
| | | | | 398/205 |
| 9,407,471 | B2* | 8/2016 | Saito | H04L 25/03 |
| 9,413,522 | B2* | 8/2016 | Tanaka | H04L 7/0058 |
| 9,917,712 | B2* | 3/2018 | Millar | H04B 10/6161 |
| 10,547,380 | B2* | 1/2020 | Ishimura | G01M 11/33 |
| 10,608,743 | B2* | 3/2020 | Takamuku | H04B 10/61 |
| 10,615,881 | B2* | 4/2020 | Abughalieh | H04B 10/6162 |
| 11,283,528 | B2* | 3/2022 | Masuda | G02F 2/00 |
| 2014/0212132 | A1* | 7/2014 | Saito | H04L 25/03 |
| | | | | 398/152 |
| 2022/0303012 | A1* | 9/2022 | Takamuku | H04B 10/614 |

* cited by examiner

ADAPTIVE EQUALIZER, EQUALIZATION METHOD, AND OPTICAL COMMUNICATION SYSTEM

CROSS-REFERENCE TO RELATED APPLICATION

This application is a national stage application under 35 U.S.C. 371 of International Application No. PCT/JP2021/019010, filed on May 19, 2021 and designated the U.S., which claims priority to Japanese Patent Application No. 2020-093039, filed on May 28, 2020. The contents of each are herein incorporated by reference.

FIELD

The present disclosure relates to an adaptive equalizer, an equalization method, and an optical communication system that compensate for transmission line characteristics in data communication.

BACKGROUND

Coherent optical communication allows a receiving side to compensate for transmission signal distortion with digital signal processing, thereby achieving high-capacity transmission of several tens of Gbit/s or more. Digital signal processing mainly involves processing of chromatic dispersion compensation, frequency control and phase adjustment, polarization demultiplexing, and polarization dispersion compensation.

Such polarization demultiplexing and polarization dispersion compensation are mainly processed using adaptive equalization. A digital filter is typically used as an adaptive equalizer in digital signal processing. Tap coefficients calculated to compensate for transmission signal distortion are set in such a digital filter, thereby enabling repair of a transmission signal. The tap coefficients of the digital filter correspond to the impulse response of the filter characteristics. The tap coefficients are sequentially updated according to a condition that changes over time, and the adaptive equalizer performs compensation following the variation of a state of polarization (SOP).

Updating tap coefficients of a digital filter constituting an adaptive equalizer commonly uses a sequential update algorithm such as a constant modulus algorithm (CMA). In accordance with this algorithm, convergence operations are performed to allow the tap coefficients to converge to predetermined values. As a result, in the adaptive equalizer, as the number of taps increases, the amount of computation increases. Further, the increase in the amount of computation causes high power consumption. A lower number of taps reduces the amount of computation, and it is thus possible to achieve low power consumption in the adaptive equalizer.

Since there has been no established method for dynamic control without performance degradation, low power consumption has conventionally been achieved by limiting the number of taps from the center tap. In other words, the number of tap coefficients has been reduced from those at both ends. However, the tap coefficients at their both ends are required under a large differential group delay (DGD) load. The DGD load refers to a delay difference between horizontally and vertically polarized signals. Therefore, limiting the number of taps from the center tap has degraded compensation accuracy.

Methods for determining an optimal number of taps according to the equalization performance of adaptive equalizers have been proposed. Examples of such proposed methods include a method for detecting a group delay time difference between polarizations of polarization-multiplexed light and determining the number of taps of an adaptive equalizer according to the group delay time difference (see, e.g., PTL1), and a method for controlling the number of taps on the basis of an error between a received pilot signal and an original pilot signal (see, e.g., PTL2).

CITATION LIST

Patent Literature

[PTL 1] JP 2018-182620 A
[PTL 2] JP 2010-118817 A

SUMMARY

Technical Problem

However, a problem with the method for determining the number of taps according to a desired equalization performance is difficulty in achieving low power consumption by reduction in the number of taps while achieving high equalization performance.

An object of the present disclosure, which has been made to solve the aforementioned problem, is to provide an adaptive equalizer, an equalization method, and an optical communication system that are able to achieve high equalization performance at low power consumption.

Solution to Problem

An adaptive equalizer according to the present disclosure includes: an adaptive filter including a first digital filter compensating for a distortion of an input signal, and a first tap coefficient updater adaptively updating a tap coefficient of the first digital filter according to a waveform state of the input signal by a convergence operation; a second digital filter compensating for the distortion of the input signal; a second tap coefficient updater adaptively updating a tap coefficient of the second digital filter according to the waveform state of the input signal by a convergence operation; and a tap-coefficient control circuit setting the tap coefficient updated by the second tap coefficient updater as an initial value of the convergence operation of the tap coefficient in the first digital filter which is to be updated by the first tap coefficient updater, arranging the tap coefficients set as the initial value in descending order of contribution degree to the convergence operation in the first tap coefficient updater, judging the tap coefficient not less than upper specified number to be valid and the tap coefficient less than the specified number to be invalid, and setting the tap coefficient of the first digital filter corresponding to the tap coefficient judged to be invalid to zero not to be used in a calculation of the first tap coefficient updater until a next judgment result is made.

Advantageous Effects

The present disclosure enables high equalization performance at low power consumption.

DESCRIPTION OF EMBODIMENTS

An adaptive equalizer, an equalization method, and an optical communication system according to the embodiments of the present disclosure will be described with reference to the drawings. The same components will be denoted by the same symbols, and the repeated description thereof may be omitted.

First Embodiment

Figure 1:
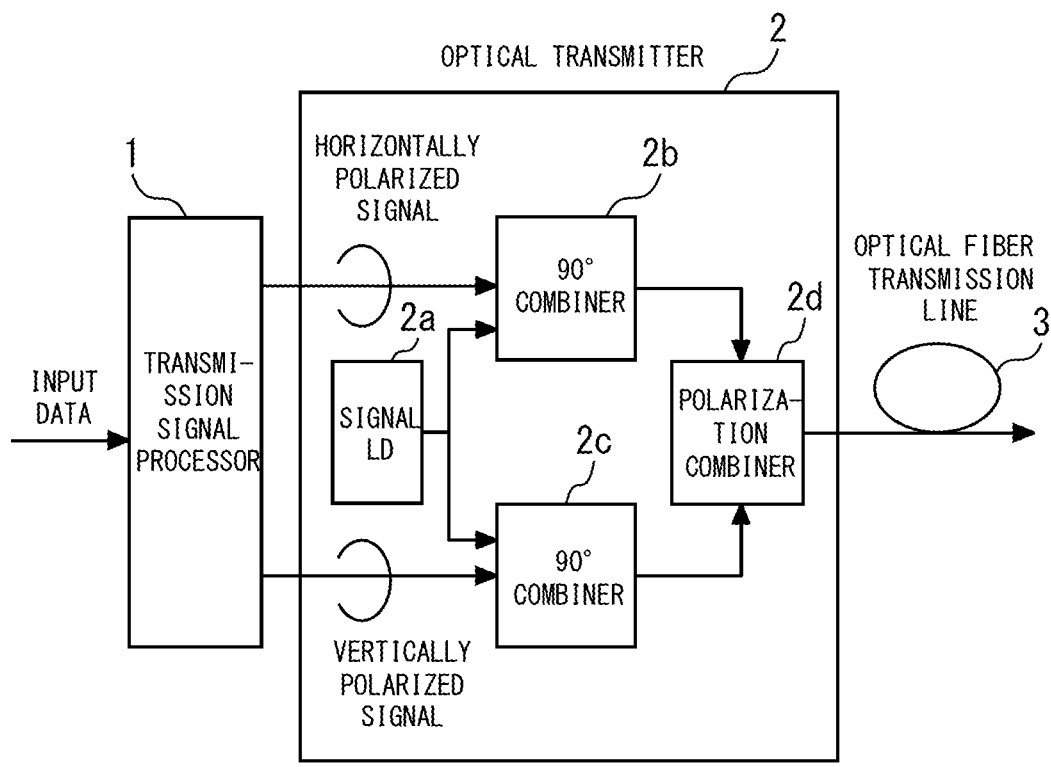
FIG. 1 is a block diagram showing a configuration of a transmission side of an optical communication system according to an embodiment.

FIG. 1 is a block diagram showing a configuration of a transmission side of an optical communication system according to an embodiment. The transmission side of the optical communication system of the present embodiment includes a transmission signal processor 1 and an optical transmitter 2.

The transmission signal processor 1 is a circuit that performs specified processing on input data. Specifically, the transmission signal processor 1 divides the input data into data for horizontal polarization and data for vertical polarization, and performs processing such as error correction coding, bandwidth limiting filtering, and modulation mapping for each data. The processed signals for horizontal and vertical polarization are output to the optical transmitter 2.

The optical transmitter 2 is a circuit that converts the signals for horizontal and vertical polarization into optical signals and transmits the converted optical signals. The optical transmitter 2 includes a signal light source 2a (signal LD), two 90-degree combiners 2b and 2c, and a polarization combiner 2d. The 90-degree combiner 2b modulates output light from the signal light source 2a with the signal for horizontal polarization, and the 90-degree combiner 2c modulates output light from the signal light source 2a with the signal for vertical polarization, thereby converting these signals into optical signals. The polarization combiner 2d combines the signals for horizontal and vertical polarization that have been converted into the optical signals. The combined optical signal is transmitted to a receiving side through an optical fiber transmission line 3.

Figure 2:
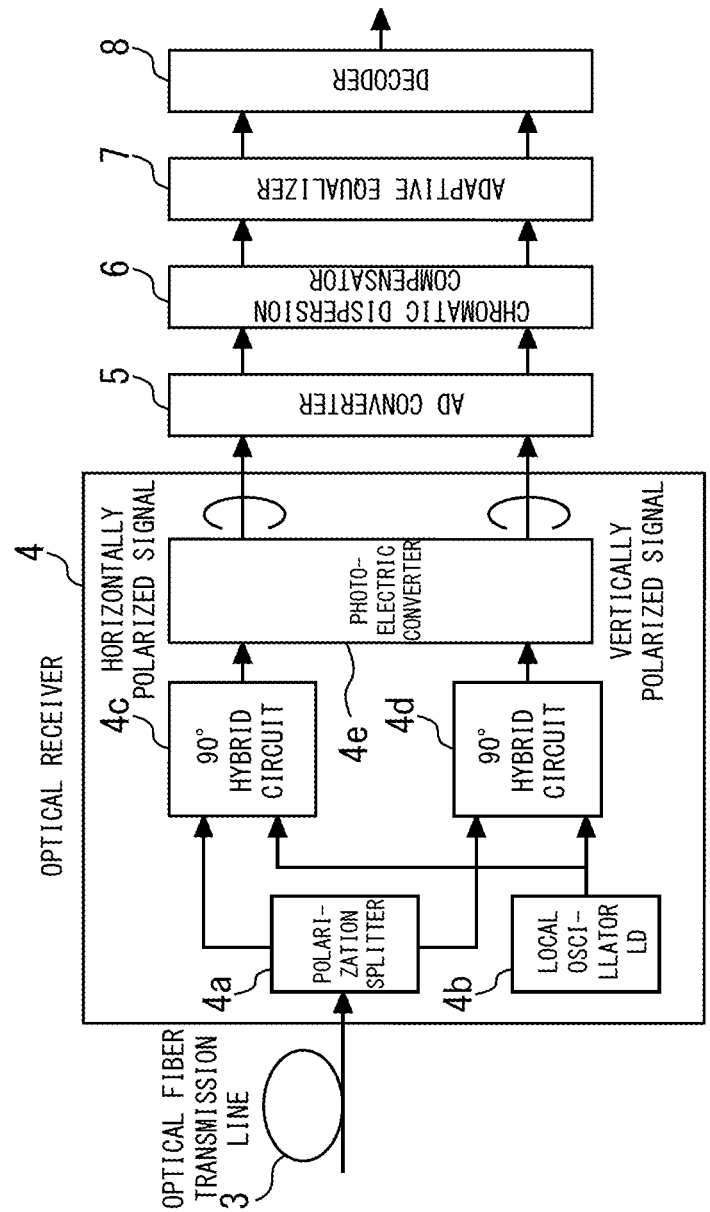
FIG. 2 is a block diagram showing a configuration of the receiving side of the optical communication system according to the embodiment.

FIG. 2 is a block diagram showing a configuration of the receiving side of the optical communication system according to the embodiment. The receiving side of the optical communication system according to the present embodiment includes an optical receiver 4, an AD converter 5, a chromatic dispersion compensator 6, an adaptive equalizer 7, and a decoder 8.

The optical receiver 4 is a circuit that receives the optical signal, converts the received optical signal into electrical signals, and outputs the signals. This optical receiver 4 includes a polarization splitter 4a, a local oscillator light source 4b (local oscillator LD), two 90-degree hybrid circuits 4c and 4d, and a photoelectric converter 4e. The polarization splitter 4a splits the optical signal into two orthogonal polarization components, namely, X-polarization (horizontal polarization) and Y-polarization (vertical polarization). The 90-degree hybrid circuits 4c and 4d combine output light from the local oscillator light source 4b with each polarization of the optical signal output from the polarization splitter 4a and further split each polarization of the optical signal into in-phase (I) and quadrature (Q) components. The photoelectric converter 4e converts the respective components of the optical signal output from the 90-degree hybrid circuits 4c and 4d into electrical signals and outputs the electrical signals as X- and Y-polarized signals. Hereinafter, each of the X- and Y-polarized signals is referred to as a received signal. Note that the above configuration for obtaining the X- and Y-polarized signals is one example and is not limiting.

The AD converter 5 converts the received signals that have been output from the optical receiver 4 into digital signals. When an optical signal propagates in the optical fiber transmission line 3, chromatic dispersion causes the waveform of the signal to distort. The chromatic dispersion compensator 6 estimates the magnitude of the distortion from the received signals output from the AD converter 5 and compensates for the distortion of the received signals due to the chromatic dispersion.

In addition, when the X- and Y-polarized signals are combined and transmitted at the transmission side, and the X- and Y-polarized signals are splitted at the receiving side, polarization mode dispersion causes polarization fluctuation, distorting the waveform of the signal. The adaptive equalizer 7 performs equalization processing that compensates for the distortion of the received signals output from the chromatic dispersion compensator 6 due to the polarization fluctuation. Note that the optical receiver 4 initially performs polarization split, and the adaptive equalizer 7 performs polarization split, more completely. The decoder 8 decodes the received signals that have been output from the adaptive equalizer 7 to reproduce the original data (i.e., input data to the transmission signal processor 1).

The adaptive equalizer 7 compensates for the distortion mainly due to the polarization fluctuation as described above and can also compensate for distortion due to frequency variation or phase variation. Thus, the adaptive equalizer 7 is useful not only when a signal of X- and Y-polarized signals that are combined at the transmission side is transmitted or received, but also when only one polarized signal is transmitted or received. Therefore, an adaptive equalizer according to the present disclosure is not limited to a case where a signal of X- and Y-polarized signals combined at the transmission side is transmitted or received. It is also useful when only one polarized signal is transmitted or received.

Figure 3:
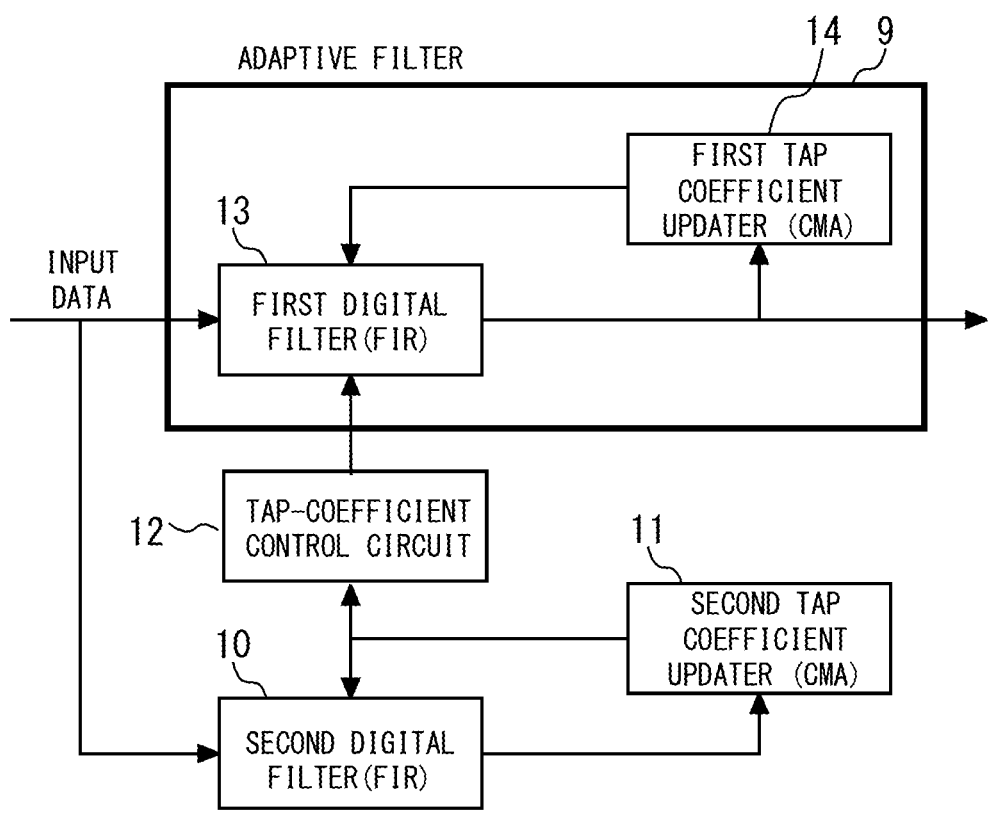
FIG. 3 is a configuration diagram of the adaptive equalizer according to the first embodiment.

FIG. 3 is a configuration diagram of the adaptive equalizer according to the first embodiment. The adaptive equalizer 7 includes an adaptive filter 9, a second digital filter 10, a second tap coefficient updater 11, and a tap-coefficient control circuit 12. The adaptive filter 9 includes a first digital filter 13 and a first tap coefficient updater 14. Here, "tap coefficient" refers to coefficients that are multiplied with respective tap signals that constitute a digital filter. In this specification, "tap coefficient" basically indicates a group of series of coefficients. In some cases, the term may indicate, and explain, each tap coefficient.

The first digital filter 13 compensates for an input signal. The compensation result is supplied to the first tap coefficient updater 14. The polarization state of the input signal varies over time. The first tap coefficient updater 14 adaptively updates the tap coefficient of the first digital filter 13 according to the polarization state of the input signal using the CMA. FIG. 3 does not show the line where the input signal of the first digital filter 13 is fed to the first tap coefficient updater 14. However, in a tap-coefficient convergence operation which will be described below, it is shown that the tap-coefficient convergence operation is performed substantially according to the input signal of the first digital filter 13. The updated tap coefficient is set in the first digital filter 13. In the CMA, the tap coefficients are sequentially updated to converge to predetermined values so that the output of the first digital filter 13 becomes what it should be.

Note that, in this specification, the term "update" of the tap coefficient applies to both an update in a convergence operation that calculates a tap coefficient for a polarization state at a certain point of time and an update performed every convergence operation at a timing when the polarization state varies.

The output from the first digital filter 13 is supplied to the decoder 8 shown in FIG. 2 as a compensated, received signal. The input signal may be both a horizontally polarized signal and vertically polarized signal or either one of them. The following description describes a case of transmission with horizontally and vertically polarized signals as a typical configuration of the coherent optical communication. The present embodiment is also applicable to a case of only one of the signals.

Note that the tap coefficient of the adaptive filter 9 can commonly be calculated at once as a Wiener solution by setting up a matrix equation. However, this requires a quite complex calculation, and thus, a sequential update algorithm is commonly used as a simple obtainment method. This is one method of the convergence operation. The algorithm for obtaining the tap coefficient of the adaptive filter 9 is not limited to the CMA and may also be various sequential update algorithms such as radius directed equalization (RDE), which is another blind equalization method. In addition, the following sequential update algorithm, such as recursive least-squares (RLS) and least mean square (LMS), can also be used: A known signal such as a training signal or a pilot signal is inserted into an optical signal at a transmission side, and a tap coefficient is updated for each step size to obtain the tap coefficient such that an error (e.g., an amplitude difference on the IQ plane or sum of squares of IQ amplitudes) between the transmitted, known signal and a true value of this known signal (a value set at the transmission side) is minimized. In the CMA, the tap coefficient is also updated to minimize an error between an output of the digital filter and a value that should be ("the value that should be" can be easily estimated as a desired value of amplitude in the case of a constant envelope).

The second digital filter 10 is connected in parallel with the first digital filter 13. As with the first digital filter 13, the second digital filter 10 compensates for the input signal, too. The second tap coefficient updater 11 also operates in the same manner as the first tap coefficient updater 14, adaptively updating the tap coefficient of the second digital filter 10 using the CMA according to the polarization state of the input signal. The tap coefficient updated in the convergence operation of the CMA is set in the second digital filter 10 for each update. Repeating this update allows the tap coefficient to converge to a predetermined value. However, unlike the output from the first digital filter 13, the output from the second digital filter 10 is not supplied to the decoder 8 as a compensated, received signal. The output from the second digital filter 10 is used only to calculate the tap coefficient of the first digital filter 13.

The tap-coefficient control circuit 12 sets the tap coefficient converged by the second tap coefficient updater 11 as an initial value of the convergence operation of the tap coefficient in the first digital filter 13 which is to be updated by the first tap coefficient updater 14. At that time, it is judged whether the tap coefficient converged by the second tap coefficient updater 11, that is, the tap coefficient that is to be set as the initial value, is valid or invalid for each tap. The tap coefficient of the first digital filter corresponding to the tap coefficient judged to be invalid is forcibly set to zero. Further, until a next judgment is made, the tap coefficient continues to be set to zero during the convergence operation in the first tap coefficient updater 14. The first digital filter 13 is disallowed to perform multiplication processing for the tap whose tap coefficient is set to zero.

Figure 4:
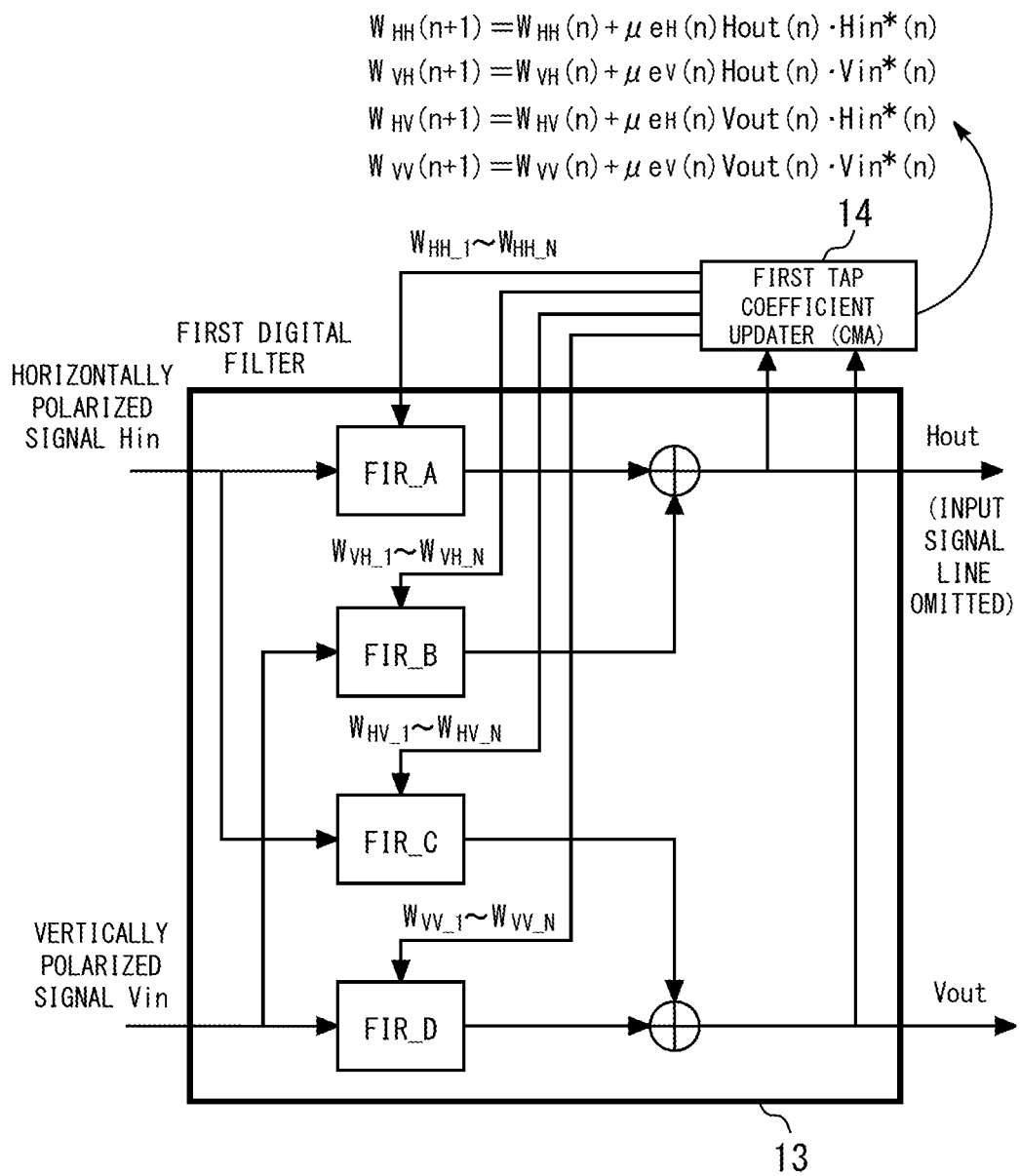
FIG. 4 is a configuration diagram of the first digital filter.

FIG. 4 is a configuration diagram of the first digital filter. The first digital filter 13 has finite impulse response (FIR) filters FIR_A, FIR_B, FIR_C, and FIR_D, configured as butterfly type. Each FIR filter has N taps. The number of taps may differ in the respective FIR filters. The second digital filter 10 may also have the same configuration as the first digital filter 13.

Figure 5:
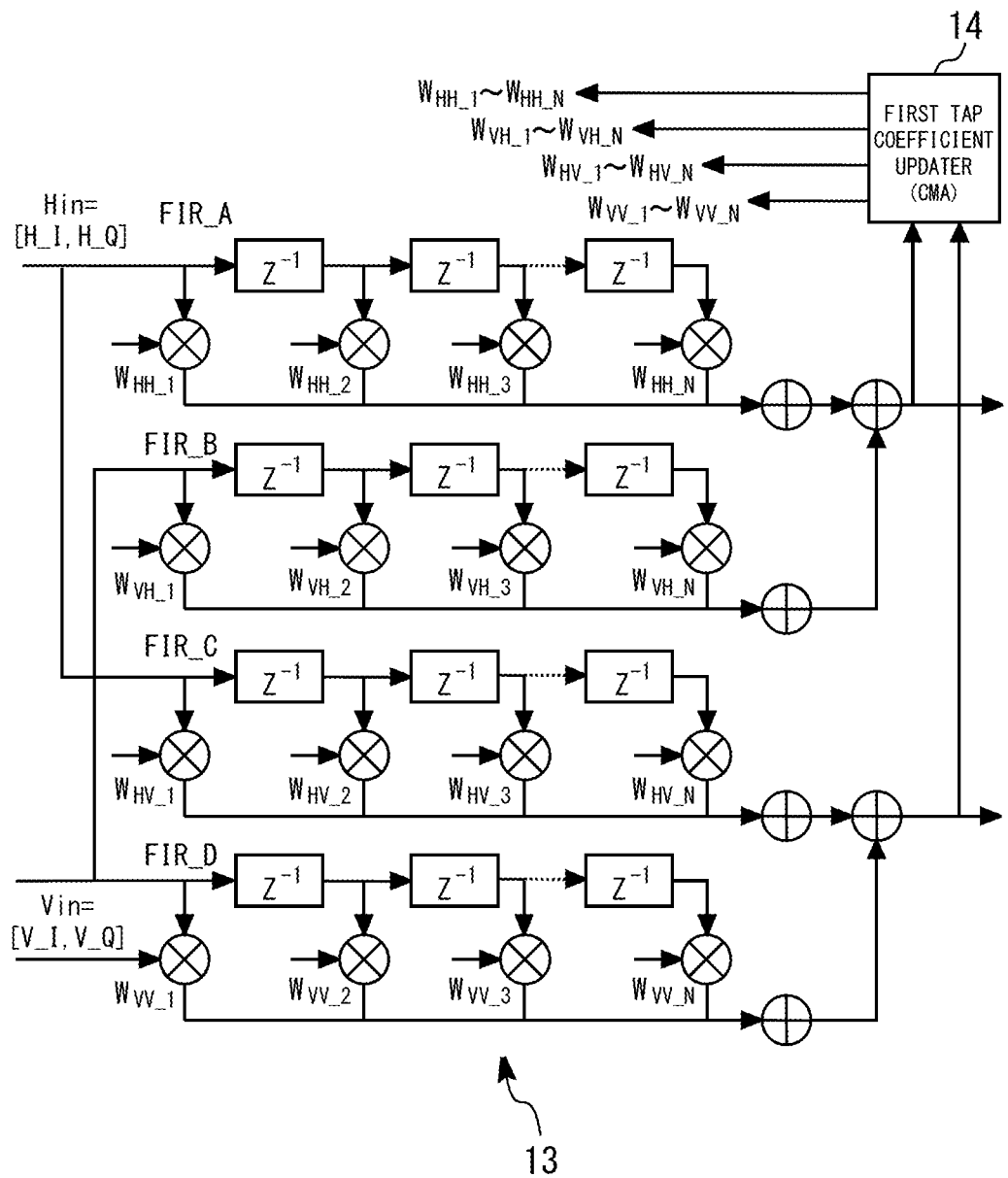
FIG. 5 is a diagram specifically showing the respective FIR filters.

FIG. 5 is a diagram specifically showing the respective FIR filters. The FIR_A is a filter to a horizontally polarized signal and has tap coefficients $W_{HH\_1}$ to $W_{HH\_N}$. The FIR_B is a filter to influence from a vertically polarized signal to the horizontally polarized signal and has tap coefficients $W_{VH\_1}$ to $W_{VH\_N}$. The FIR_C is a filter to influence from the horizontally polarized signal to the vertically polarized signal and has tap coefficients $W_{HV\_1}$ to $W_{HV\_N}$. The FIR_D is a filter to the vertically polarized signal and has tap coefficients $W_{VV\_1}$ to $W_{VV\_N}$. N denotes the number of taps. The respective tap coefficients are multiplied with sequentially delayed input signals, and their sum is output as the filter result. $Z^{\wedge}(-1)$ indicates sequential delay.

The first digital filter 13 considers the sum of an FIR_A filtering result to the horizontally polarized signal and an FIR_B filtering result to the vertically polarized signal as a compensation output for the horizontally polarized signal, and the sum of an FIR_C filtering result to the horizontally polarized signal and an FIR_D filtering result to the vertically polarized signal as a compensation output for the vertically polarized signal. Note that the first digital filter 13 is not limited to the butterfly type configuration and may be configured without FIR_B and FIR_C.

The first digital filter 13 and the first tap coefficient updater 14 constitute the adaptive filter 9. In that case, the convergence operations of the tap coefficients of the FIR_A, FIR_B, FIR_C, and FIR_D are expressed by the following equations:

$$W_{HH}(n+1) = W_{HH}(n) + \mu e_H(n) H_{out}(n) H_{in}^*(n)$$

$$W_{VH}(n+1) = W_{VH}(n) + \mu e_V(n) H_{out}(n) V_{in}^*(n)$$

$$W_{HV}(n+1) = W_{HV}(n) + \mu e_H(n) V_{out}(n) H_{in}^*(n)$$

$$W_{VV}(n+1) = W_{VV}(n) + \mu e_V(n) V_{out}(n) V_{in}^*(n)$$

where n is a value indicating an update order in the sequential update algorithm; the tap coefficient $W_{HH}(n)$ indicates the tap coefficients $W_{HH\_1}$ to $W_{HH\_N}$ in a case where the update order is n; the tap coefficient $W_{VH}(n)$ indicates the tap coefficients $W_{VH\_1}$ to $W_{VH\_N}$ in a case where the update order is n; the tap coefficient $W_{HV}(n)$ indicates the tap coefficients $W_{HV\_1}$ to $W_{HV\_N}$ in the case where the update order is n; the tap coefficient $W_{VV}(n)$ indicates the tap coefficients $W_{VV\_1}$ to $W_{VV\_N}$ in the case where the update order is n; μ indicates a step size of the update algorithm; $e_H(n)$ indicates an error from a desired value at a filter output in horizontal polarization; $e_V(n)$ indicates an error from a desired value at a filter output in vertical polarization; $H_{out}(n)$ indicates the filter output in horizontal polarization; $H_{in}(n)$ indicates a filter input in horizontal polarization; $V_{out}(n)$ indicates the filter output in vertical polarization; $V_{in}(n)$ indicates a filter input in vertical polarization; and * indicates conjugate or complex conjugate. Note that FIGS. 4 and 5 do not show the line of the input signal to the first tap coefficient updater 14. The signal and the tap coefficient are expressed in complex numbers.

Note that the above equations are examples of equations that represent the sequential update algorithm and are not limiting as the equations that represent the sequential update algorithm. The equations may be any equations that express the update of values according to the step size. This step size determines tracking and noise tolerance of digital signal processing in the adaptive control of the above-described tap coefficient. A larger step size improves digital signal processing tracking and reception tolerance to high-speed polarization state fluctuations, but deteriorates transmission characteristics due to effects of noise during low-speed polarization state fluctuations.

The above sequential update algorithm sequentially updates the tap coefficients in the update order n, finally causing convergence of the tap coefficients. A convergence condition is judged according to the number of times in the update order n, or the error between the filter output and the desired value. The above convergence of the algorithm obtains the tap coefficients $W_{HH\_1}$ to $W_{HH\_N}$, $W_{VH\_1}$ to $W_{VH\_N}$, $W_{HV\_1}$ to $W_{HV\_N}$, and $W_{VV\_1}$ to $W_{VV\_N}$ of the respective FIR filters.

As with the above description, the second digital filter 10 and the second tap coefficient updater 11 also obtain the tap coefficients $W_{HH\_1}$ to $W_{HH\_N}$, $W_{VH\_1}$ to $W_{VH\_N}$, $W_{HV\_1}$ to $W_{HV\_N}$, and $W_{VV\_1}$ to $W_{VV\_N}$ of the respective FIR filters. Note that the interval of the update order n may differ between the first tap coefficient updater 14 and the second tap coefficient updater 11 and does not have to coincide with a symbol cycle (the cycle in which the data values are changed or updated). In addition, the convergence condition may also differ between the first tap coefficient updater 14 and the second tap coefficient updater 11. The symbol cycle is different from the sequential delay timings $Z^{-1}(-1)$ of the FIR filters.

Figure 6:
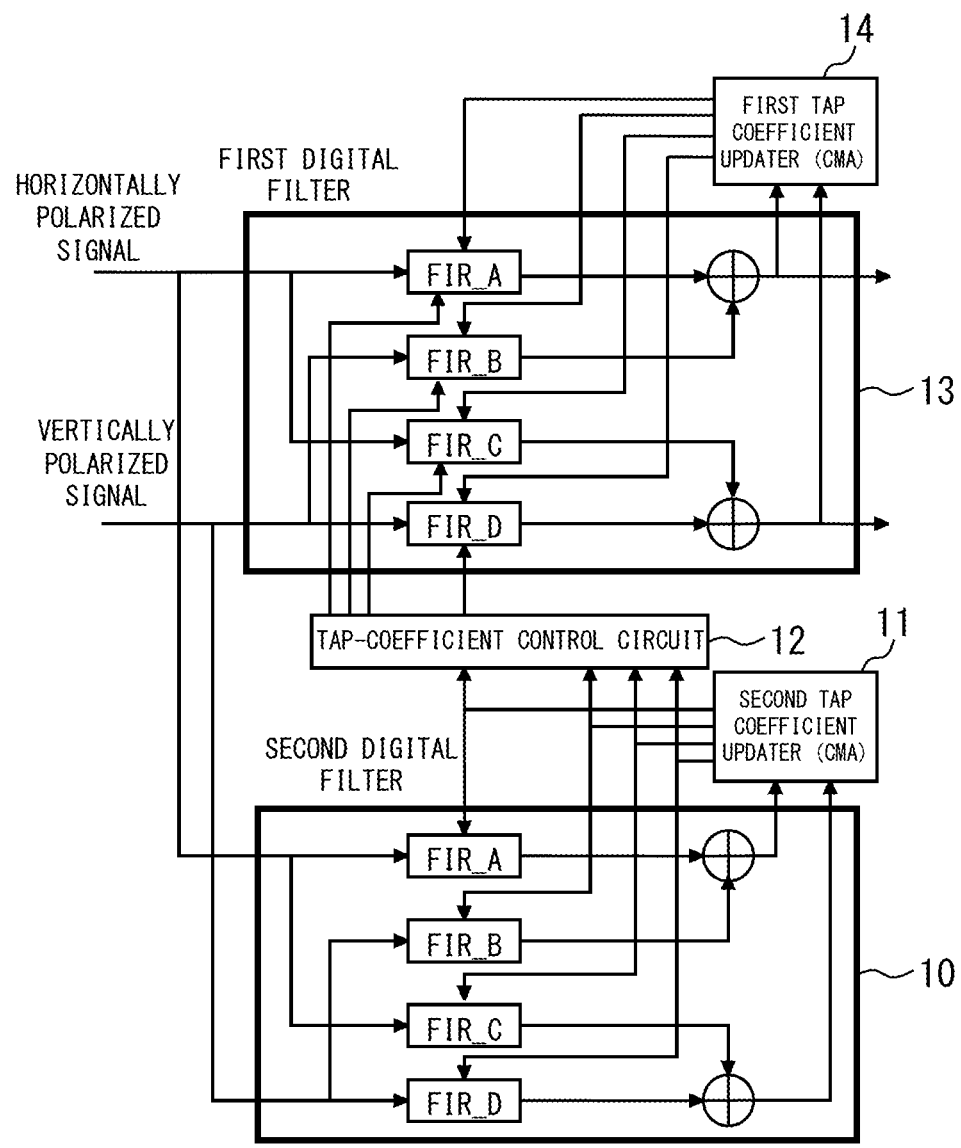
FIG. 6 is a diagram showing an example of the adaptive equalizer according to the first embodiment.

FIG. 6 is a diagram showing an example of the adaptive equalizer according to the first embodiment. In this example, the first digital filter 13, second digital filter 10, and wiring between them in the adaptive equalizer 7 shown in FIG. 3 are detailed.

Hereinafter, the operation of the adaptive equalizer according to the first embodiment will be described. The tap coefficients obtained by the second digital filter 10 and the second tap coefficient updater 11 using the CMA are supplied to the tap-coefficient control circuit 12. These tap coefficients are $W_{HH\_1}$ to $W_{HH\_N}$, $W_{VH\_1}$ to $W_{VH\_N}$, $W_{HV\_1}$ to $W_{HV\_N}$, and $W_{VV\_1}$ to $W_{VV\_N}$.

The tap-coefficient control circuit 12 judges whether all of the taps are valid or invalid on the basis of the algorithm that will be described later. The tap judged to be invalid is changed to zero and set in the tap of the first digital filter 13 as the initial value in a CMA convergence operation of the first tap coefficient updater 14. At this case, the tap coefficient that contributes significantly to the tap-coefficient convergence operation is judged to be valid, and a tap coefficient other than the above tap coefficient or a tap coefficient that contributes less to the tap-coefficient convergence operation is judged to be invalid.

After the initial value is set, the first digital filter 13 and the first tap coefficient updater 14 perform the tap-coefficient convergence operation using the CMA. In the first embodiment, the value of the first digital filter 13 during the tap-coefficient convergence operation, i.e., during the convergence process is also output. Furthermore, the tap set as zero by the tap-coefficient control circuit 12 continues to be set to zero regardless of the update result of the first tap coefficient updater 14 until the next convergence result is provided. The tap coefficient set to zero is adjusted so as not to be used for the calculation of the first tap coefficient updater 14. Even if it is used, the circuit should be designed such that power consumption is as close to zero as possible.

For example, the output of the FIR_A of the first digital filter 13 is expressed by the following equation at the nth update:

$$H_{out}(n) = H_{in\_1}(n) \cdot W_{HH\_1}(n) + H_{in\_2}(n) \cdot W_{HH\_2}(n) + H_{in\_3}(n) \cdot W_{HH\_3}(n) + \ldots H_{in\_N}(n) \cdot W_{HH\_N}(n)$$

where $H_{in\_1}(n)$ to $H_{in\_N}(n)$ are signals in which the horizontally polarized signal $H_{in}(n)$ is sequentially delayed in the FIR_A. In the initial value, n is zero times.

Here, consider a case where the tap-coefficient control circuit 12 sets the tap coefficients $W_{HH\_1}(0)$ to $W_{HH\_N}(0)$ as the initial values in the first digital filter 13. At that time, if the second tap coefficient of the FIR_A is set such that both the real and imaginary parts are zero, i.e., is set to $W_{HH\_2}(0) = 0 + j \cdot 0$, the following equation is satisfied:

$$\begin{aligned} H_{out}(0) &= H_{in\_1}(0) \cdot W_{HH\_1}(0) + H_{in\_2}(0) \cdot W_{HH\_2}(0) + H_{in\_3}(0) \cdot \\ &\quad W_{HH\_3}(0) + \ldots H_{in\_N}(0) \cdot W_{HH\_N}(0) \\ &= H_{in\_1}(0) \cdot W_{HH\_1}(0) + 0 + H_{in\_3}(0) \cdot W_{HH\_3}(0) + \ldots \\ &\quad H_{in\_N}(0) \cdot W_{HH\_N}(0) \end{aligned}$$

Next, $W_{HH\_1}(1)$ to $W_{HH\_N}(1)$ are calculated using the CMA algorithm. At this time, even if a finite value is calculated as the value of $W_{HH\_2}(1)$, the tap coefficient of the FIR_A is calculated as $W_{HH\_2}(n) = 0 + j \cdot 0$. That is, in the second tap, results of both the multiplication of the real part and the multiplication of the imaginary part are set to zero from the beginning. This continues until the tap-coefficient control circuit 12 sets a next initial value. The zero-settings of the tap coefficients are performed independently for the four FIR filters, and real and imaginary parts.

Figure 7:
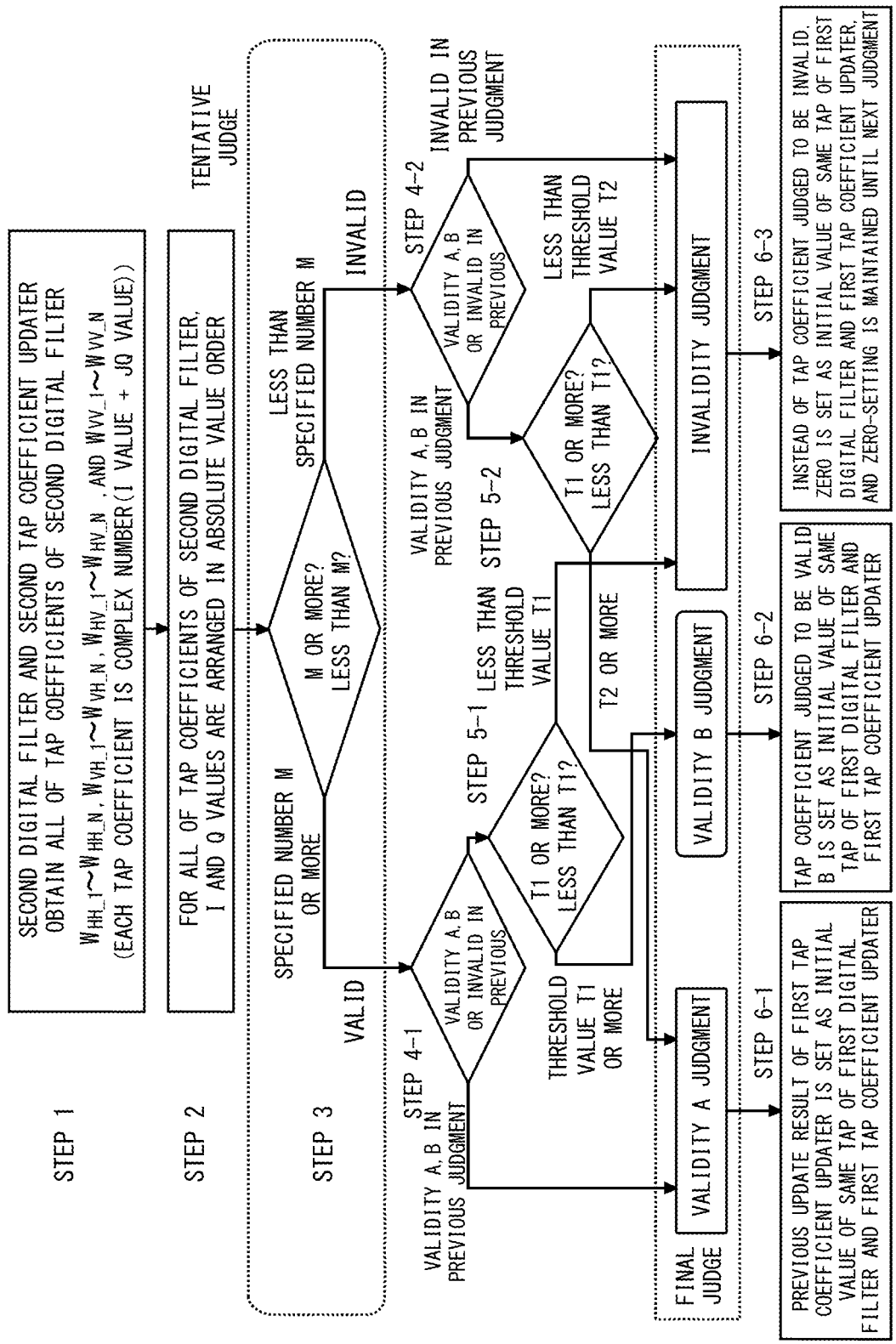
FIG. 7 is a flowchart of the tap-coefficient validity/invalidity judgment algorithm in the tap-coefficient control circuit.

Next, a tap-coefficient validity/invalidity judgment algorithm in the tap-coefficient control circuit 12 will be described. FIG. 7 is a flowchart of the tap-coefficient validity/invalidity judgment algorithm in the tap-coefficient control circuit.

The tap-coefficient validity/invalidity judgment algorithm refers to an algorithm that judges whether a calculated tap coefficient is valid or invalid (hereinafter described to be a validity/invalidity judgment). The tap-coefficient validity/invalidity judgment in the tap-coefficient control circuit 12 is made each time when the second digital filter 10 and the second tap coefficient updater 11 complete the convergence operation of the sequential update algorithm of the tap coefficients and obtain the tap coefficient.

Operations of respective steps will be described below. First, as step 1, the second digital filter 10 and the second tap coefficient updater 11 obtain all of the tap coefficients $W_{HH\_1}$ to $W_{HH\_N}$, $W_{VH\_1}$ to $W_{VH\_N}$, $W_{HV\_1}$ to $W_{HV\_N}$, and $W_{VV\_1}$ to $W_{VV\_N}$ of the second digital filter 10 on the basis of the sequential update algorithm. These values are obtained after the completions of the convergence operation of the sequential update algorithm. Each tap coefficient is denoted by coordinates (I value+jQ value) on an IQ plane. I+jQ is a so-called complex number.

Next, as step 2, for all of the tap coefficients of the second digital filter 10 obtained in step 1, the I and Q values on the IQ plane are collectively arranged in descending order of its absolute value. In this case, it is possible to perform the validity/invalidity judgment for only the I value or the Q value. However, in an experimental validation, the validity/invalidity judgment of the I and Q values together yielded higher performance than the separate judgments. As shown in FIG. 6, when both the horizontally and vertically polarized signals are processed, it is possible to perform the validity/invalidity judgment of the I and Q values of the four FIR filters, collectively. In this case, the validity/invalidity judgments of the four FIR filters together yield higher performance than the separate judgments of the individual filters.

Next, as step 3 (a first judgment), among the tap coefficients arranged in absolute value order, tap coefficients not less than an upper specified number M are tentatively judged to be valid and tap coefficients less than the specified number M to be invalid. Here, the larger the absolute value of the tap coefficients, the greater the degree of contribution to the calculation (convergence operation) of the tap coefficient update in the first tap coefficient updater 14. Therefore, the tap coefficients updated by the second tap coefficient updater 11 are arranged in descending order of the contribution degree to the calculation (convergence operation) in the first tap coefficient updater 14, and the tap coefficients not less than the upper specified number are judged to be valid and the tap coefficients less than the specified number to be invalid.

As step 4-1 (a second judgment), if the tap coefficient tentatively judged to be valid at step 3 was judged to be valid A or B in the previous second judgment, it is finally judged to be valid A (final validity "A" judgment). In contrast, if the tap coefficient was judged to be invalid in the previous second judgment, the process proceeds to step 5-1.

As step 4-2 (the second judgment), if the tap coefficient tentatively judged to be invalid at step 3 was also judged to be invalid in the previous second judgment, it is finally judged to be invalid (final invalidity judgment). In contrast, if the tap coefficient was judged to be valid in the preceding second judgment, the process proceeds to step 5-2.

As step 5-1 (the second judgment), if the tap coefficient tentatively judged at step 4-1 to have been invalid in the previous second judgment has an absolute value that is a threshold value T1 or more, it is finally judged to be valid B (final validity "B" judgment). In contrast, if the absolute value is less than the threshold value T1, it is finally judged to be invalid (final invalidity judgment).

Next, as step 5-2 (the second judgment), if the tap coefficient judged at step 4-2 to have been valid A or B in the previous second judgment has an absolute value that is a threshold value T2 or more, it is finally judged to be valid A (final validity "A" judgment). In contrast, if the absolute value is less than the threshold value T2, it is finally judged to be invalid (final invalidity judgment). Note that the threshold value T1 in step 5-1 and the threshold value T2 in step 5-2 may be different from or the same as each other. The above algorithm is used to make a validity/invalidity judgment for all of the tap coefficients.

As step 6-1, the tap-coefficient control circuit 12 does not use the tap coefficient finally judged to be valid A but instead sets the previous update result of the first tap coefficient updater 14 as the initial value of the tap coefficient of the first digital filter 13 that is to be updated by the first tap coefficient updater 14. The set coefficient is not zero because it was previously judged to be valid. Therefore, it is judged that it is unnecessary to set the new result of the second tap coefficient update to the initial value.

As step 6-2, the tap-coefficient control circuit 12 sets the tap coefficient finally judged to be valid B as the initial value of the tap coefficient of the first digital filter 13 which is to be updated by the first tap coefficient updater 14. The set coefficient is zero because it was previously judged to be invalid. Therefore, it is necessary to set the initial value because of necessity of a new setting.

As step 6-3, the tap-coefficient control circuit 12 sets the initial value of the tap coefficient of the first digital filter 13 corresponding to the tap coefficient judged to be invalid to zero. In addition, this zero-setting is maintained until a next judgment is made and a new initial value is set. Note that if the tap coefficient is set to zero, the multiplication of the tap coefficient and the addition of the multiplication result should be avoided. This is achieved by creating an equation with zero set in advance in a filter calculation expression and inputting the updated tap coefficient to that equation.

As described above, the tap-coefficient validity/invalidity judgment algorithm uses one previous judgment result and an optionally set threshold value to judge validity/invalidity of the tap coefficient. However, the judgment method is not limited to the above method. Combining previous judgment results with multiple threshold values enables various judgment algorithms.

Figure 8:
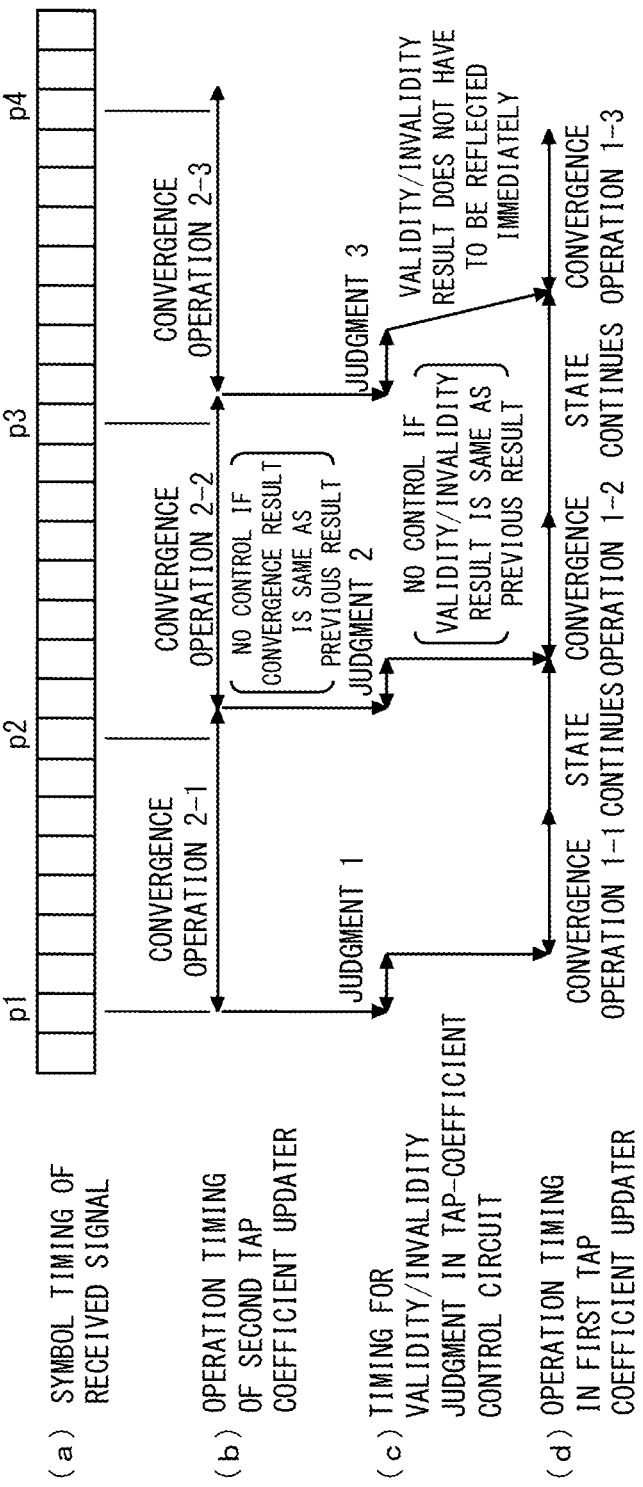
FIG. 8 is a diagram showing an operation timing of the adaptive equalizer according to the first embodiment.

FIGS. 8(*a*) to 8(*d*) are diagrams showing an operation timing of the adaptive equalizer according to the first embodiment. FIG. 8(*a*) shows a symbol timing of a received signal. FIG. 8(*b*) shows an operation timing of the second tap coefficient updater 11. FIG. 8(*c*) shows a timing for validity/invalidity judgment in the tap-coefficient control circuit 12. FIG. 8(*d*) shows an operation timing in the first tap coefficient updater 14. The symbol describe here refers to a cycle where data of a received signal is changed or updated.

FIG. 8 is a diagram showing an operation timing of the adaptive equalizer according to the first embodiment. (a) of FIG. 8 shows a symbol timing of a received signal. (b) of FIG. 8 shows an operation timing of the second tap coefficient updater 11. (c) of FIG. 8 shows a timing for validity/invalidity judgment in the tap-coefficient control circuit 12. (d) of FIG. 8 shows an operation timing in the first tap coefficient updater 14. The symbol describe here refers to a cycle where data of a received signal is changed or updated.

As shown in (a) and (b) of FIG. 8, a convergence operation 2-1 in the second tap coefficient updater 11 is performed from symbols p1 to p2 of the received signal. Likewise, a convergence operation 2-2 in the second tap coefficient updater 11 is performed from symbols p2 to p3, and a convergence operation 2-3 in the second tap coefficient updater 11 is performed from symbols p3 to p4. Regarding the tap coefficients of the second digital filter 10 obtained in the respective convergence operations, as shown in (c) of FIG. 8, the tap-coefficient control circuit 12 makes the validity/invalidity judgments. Each judgment result is reflected on the convergence operation in the first tap coefficient updater 14, as shown in (d) of FIG. 8. Here, the number of the symbols from the symbols p1 to p2, the number of the symbols from symbols p2 to p3, and the number of the symbols from symbols p3 to p4 may be the same or different. In addition, a convergence operation 1-1, a convergence operation 1-2, and a convergence operation 1-3 in the first tap coefficient updater 14 shown in (d) of FIG. 8 are not necessarily the same according to the convergence condition.

For example, the tap coefficient obtained in the convergence operation 2-1 of the second tap coefficient updater 11 is judged as a judgment 2 in the tap-coefficient control circuit 12. The tap coefficient judged as the second judgment is reflected on the convergence operation 1-2 in the first tap coefficient updater 14. That is, the tap coefficient judged is set as the initial value in the convergence operation 1-2, performing the convergence operation 1-2. After the convergence operation 1-2 of the first tap coefficient updater 14 converges, the convergence result is continuously used until the next convergence operation 1-3 is started.

Among the above operations, if the tap coefficient obtained in the convergence operation 2-1 is the same as that obtained in the previous convergence operation, it is unnecessary to control the tap-coefficient control circuit 12 (including the validity/invalidity judgment), and the judgment result (a judgment 1) used in the convergence operation 1-1 in the first tap coefficient updater 14 can further continue (not shown) until a next judgment (a judgment 3) is made. Even if the judgment 2 is the same as the judgment 1, no further control is performed, and the judgment result (the judgment 1) used in the convergence operation 1-1 in the first tap coefficient updater 14 continues until the next judgment (the judgment 3) is further made (not shown).

The result of the validity/invalidity judgment of the tap-coefficient control circuit 12 does not have to be reflected immediately, as shown from the convergence operation 1-3 to the judgment 3. It can also be delayed somewhat in consideration of circuit delay and other factors.

The second tap coefficient updater 11 and the first tap coefficient updater 14 do not necessarily have to refer to, and use, the same symbol. Aside from the example of FIG. 8, for example, it may be possible that, although the symbols used for coefficient updating are the 1st, 11th, and 21st symbols, the symbols used by the first tap coefficient updater 14 are the 2nd, 12th, and 22nd symbols.

As described above, according to the present embodiment, it is judged whether the tap coefficient converged in the second tap coefficient updater 11 is valid or invalid, and the tap coefficient of the first digital filter 13 corresponding to the tap coefficient judged to be invalid is set to zero until the next judgment result is made, so that it is not used in the calculation of the first tap coefficient updater 14. This achieves low power consumption. In addition, the tap coefficients updated by the second tap coefficient updater 11 are arranged in descending order of the contribution degree to the calculation in the first tap coefficient updater 14, and the tap coefficients not less than the upper specified number are judged to be valid and the tap coefficients less than the specified number to be invalid. In this way, taps whose tap coefficient values are judged to contribute less to equalization process are not calculated. This enables high equalization performance at low power consumption.

Second Embodiment

Figure 9:
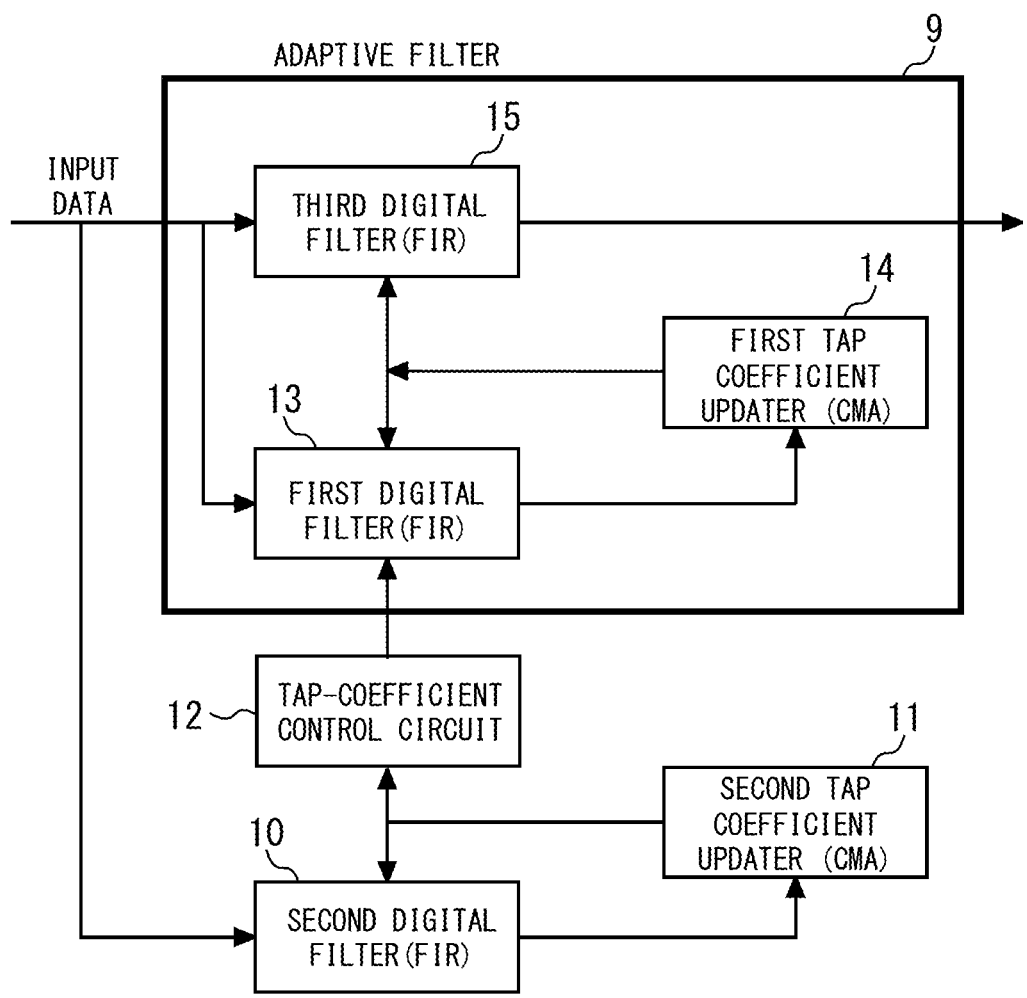
FIG. 9 is a configuration diagram of an adaptive equalizer according to a second embodiment.

FIG. 9 is a configuration diagram of an adaptive equalizer according to a second embodiment. The adaptive equalizer 7 according to the present embodiment is different from the adaptive equalizer 7 according to the first embodiment shown in FIG. 3 in that a third digital filter 15 having the same configuration as the first digital filter 13 is connected in parallel with the first digital filter 13.

In the first embodiment, the output from the first digital filter 13 is supplied to the first tap coefficient updater 14 and to the decoder 8 shown in FIG. 2 as the output from the adaptive filter 9. In contrast, according to the present embodiment, the output from the third digital filter 15 serves as the output from the adaptive filter 9, and the output from the first digital filter 13 is supplied only to the first tap coefficient updater 14.

At that time, as the tap coefficient of the third digital filter 15, the same tap coefficient as the tap coefficient of the first digital filter 13 is set. However, the result of the previous convergence operation is maintained during the convergence operation of the first tap coefficient updater 14, and a new convergence result is set after the convergence operation is completed. This disallows the tap coefficient of the third digital filter 15 to vary during the convergence operation of the first digital filter 13 and the first tap coefficient updater 14, thus obtaining a stable compensation output. In addition, the configurations and operations of the second digital filter 10, the second tap coefficient updater 11, and the tap-coefficient control circuit 12 are the same as those in the first embodiment.

Figure 10:
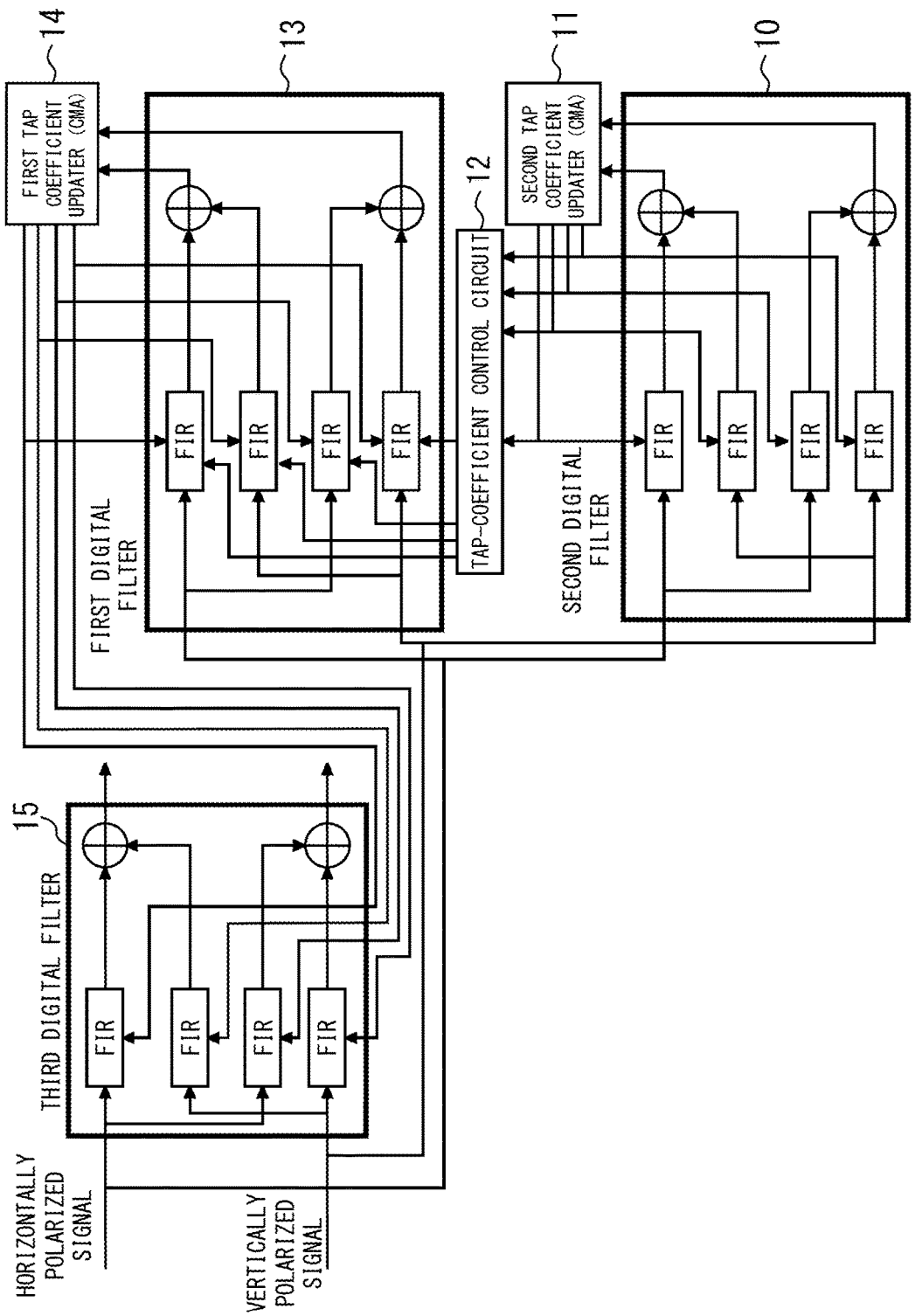
FIG. 10 is a diagram showing an example of the adaptive equalizer according to the second embodiment.

FIG. 10 is a diagram showing an example of the adaptive equalizer according to the second embodiment. In this example, the first digital filter 13, the second digital filter 10, the third digital filter 15, and wiring between them in the adaptive equalizer 7 shown in FIG. 9 are detailed.

Hereinafter, the operation of the adaptive equalizer according to the second embodiment will be described. The tap coefficients obtained by the second digital filter 10 and the second tap coefficient updater 11 using the CMA are supplied to the tap-coefficient control circuit 12. These tap coefficients are $W_{HH\_1}$ to $W_{HH\_N}$, $W_{VH\_1}$ to $W_{VH\_N}$, $W_{HV\_1}$ to $W_{HV\_N}$, and $W_{VV\_1}$ to $W_{VV\_N}$.

The tap-coefficient control circuit 12 judges whether all of the taps are valid or invalid on the basis of the algorithm described above. The tap-coefficient control circuit 12 changes the tap judged to be invalid to zero and set it in the tap of the first digital filter 13 as the initial value for the CMA operation in the first tap coefficient updater 14.

After the initial value is set, the first digital filter 13 and the first tap coefficient updater 14 perform a tap-coefficient convergence operation using the CMA. The tap set as zero by the tap-coefficient control circuit 12 continues to be set to zero regardless of the update result of the first tap coefficient updater 14 until the next convergence result is provided. The tap with the zero tap coefficient is set so that no multiplication and addition is performed. Even if it is performed, the circuit should be designed such that power consumption is as close to zero as possible.

In this configuration, during the convergence operation of the tap coefficient, the third digital filter 15 continues to operate with the tap coefficient obtained in the previous convergence operation, and its output becomes the output of the adaptive equalizer 7. After the convergence operation by the first digital filter 13 and the first tap coefficient updater 14, the tap coefficient obtained from the operation is set in the third digital filter 15. Thereafter, the third digital filter 15 continues to operate with the previous tap coefficient until a next convergence result (tap coefficient) is set from the first tap coefficient updater 14.

As described above, the adaptive equalizer 7 according to the second embodiment also does not calculate the tap with the tap coefficient whose absolute value is small. This enables high equalization performance at low power consumption. Furthermore, the tap coefficient of the third digital filter 15 through which the main signal passes does not fluctuate during the convergence operation, thus obtaining a stable compensation output.

In addition, compared to the first and second digital filters used for coefficient updating, the third digital filter, since becoming irrelevant to convergence, can reduce the bit resolution of the filter coefficients for all main signal inputs to a level that does not cause signal degradation without losing convergence error, enabling low power consumption.

The sequential update algorithm described above defines a step size that is an indicator of the width of the tap coefficient updates. The step size of the sequential update algorithm of the first tap coefficient updater 14 may be changed according to the ratio of the number of tap coefficients judged to be invalid to the overall number of tap coefficients updated by the second tap coefficient updater 11. For example, in a situation where the number of tap coefficients judged to be invalid is half the overall number of tap coefficients, the error between the filter output and the desired value is also half. Therefore, the step size needs to be doubled to maintain tracking speed. Therefore, as the ratio of the number of tap coefficients judged to be invalid to the overall number of tap coefficients increases, the error to be added to the tap coefficients appears smaller, and thus, the step size needs to be increased by the amount.

As described above, if the tap coefficient judged to be invalid is set to zero, the first digital filter 13 performs no multiplication until the next judgment is made. Examples of its specific method include a method where no feedback is performed from the first tap coefficient updater 14 to that tap coefficient number judged to be invalid, a method for setting a feedback value to zero, and a method for setting the tap coefficient to zero after feedback.

The timings for coefficient update in the first and second tap coefficient updaters 14 and 11 can be performed every one symbol. In this case, it is possible to update the coefficient every one symbol and make the validity/invalidity judgment every several dozens of symbols.

REFERENCE SIGNS LIST 4 optical receiver; 5 AD converter; 7 adaptive equalizer; 9 adaptive filter; 10 second digital filter; 11 second tap coefficient updater; 12 tap-coefficient control circuit; 13 first digital filter; 14 first tap coefficient updater; 15 third digital filter

The invention claimed is:

1. An adaptive equalizer comprising:
an adaptive filter including a first digital filter compensating for a distortion of an input signal, and a first tap coefficient updater adaptively updating a tap coefficient of the first digital filter according to a polarization state of the input signal by a convergence operation;
a second digital filter compensating for the distortion of the input signal;
a second tap coefficient updater adaptively updating a tap coefficient of the second digital filter according to the polarization state of the input signal by a convergence operation; and
a tap-coefficient control circuit setting the tap coefficient converged by the second tap coefficient updater as an initial value of the tap coefficient in the first digital filter which is to be updated by the first tap coefficient updater, arranging the tap coefficients converged by the second tap coefficient updater in descending order of contribution degree to the convergence operation of tap coefficient update in the first tap coefficient updater, judging the tap coefficient not less than upper specified number to be valid and the tap coefficient less than the specified number to be invalid, and setting the tap coefficient of the first digital filter corresponding to the tap coefficient judged to be invalid to zero not to be used in a calculation of the first tap coefficient updater until a next judgment result is made.

2. The adaptive equalizer according to claim 1, wherein the tap-coefficient control circuit, as a first judgment, collectively arrange I and Q values on an IQ plane in descending order of absolute value for a plurality of tap coefficients updated by the second tap coefficient updater, and judges the tap coefficient not less than the upper specified number to be valid and the tap coefficient less than the specified number to be invalid, and
the larger the absolute value of the tap coefficient, the greater the degree of contribution to the convergence operation of the tap coefficient update in the first tap coefficient updater.

3. The adaptive equalizer according to claim 2, wherein the tap-coefficient control circuit, as a second judgment for judging the tap coefficient to be valid A, valid B or invalid after the first judgment, judges the tap coefficient to be valid A if the tap coefficient judged to be valid at the first judgment was judged to be valid A or valid B in a previous second judgment, judges the tap coefficient to be valid B if the tap coefficient judged to be valid at the first judgment is a first threshold value or more and was judged to be invalid in the previous second judgment, judges the tap coefficient to be invalid if the tap coefficient judged to be valid at the first judgment is less than the first threshold value and was judged to be invalid in the previous second judgment, judges the tap coefficient to be invalid if the tap coefficient judged to be invalid at the first judgment was judged to be invalid in the previous second judgment, judges the tap coefficient to be valid A if the tap coefficient judged to be invalid at the first judgment is a second threshold value or more and was judged to be valid A or valid B in the previous second judgment, and judges the tap coefficient to be invalid if the tap coefficient judged to be invalid at the first judgment is less than the second threshold value and was judged to be valid A or valid B in the previous second judgment.

4. The adaptive equalizer according to claim 3, wherein the tap-coefficient control circuit does not use the tap coefficient judged to be valid A but instead sets a previous update result of the first tap coefficient updater as an initial value of the tap coefficient of the first digital filter that is to be updated by the first tap coefficient updater, and sets the tap coefficient judged to be valid B as the initial value of the tap coefficient of the first digital filter which is to be updated by the first tap coefficient updater.

5. The adaptive equalizer according to claim 1, wherein the first tap coefficient updater updates the tap coefficient of the first digital filter by a sequential update algorithm, and
the second tap coefficient updater updates the tap coefficient of the second digital filter by a sequential update algorithm.

6. The adaptive equalizer according to claim 5, wherein the adaptive filter includes a third digital filter compensating for the distortion of the input signal using the tap coefficient obtained by converging the update operation of the first tap coefficient updater.

7. The adaptive equalizer according to claim 5, wherein a step size of the sequential update algorithm of the first tap coefficient updater is changed according to a ratio of the number of tap coefficients judged to be invalid to the overall number of tap coefficients updated by the second tap coefficient updater.

8. The adaptive equalizer according to claim 7, wherein as the ratio increases, the step size is increased.

9. An equalization method comprising:
compensating for a distortion of an input signal by a first digital filter;
adaptively updating a tap coefficient of the first digital filter according to a polarization state of the input signal by a convergence operation of a first tap coefficient updater;
compensating for the distortion of the input signal by a second digital filter;
adaptively updating a tap coefficient of the second digital filter according to the polarization state of the input signal by a convergence operation of a second tap coefficient updater; and
setting, by a tap-coefficient control circuit, the tap coefficient converged by the second tap coefficient updater as an initial value of the tap coefficient in the first digital filter which is to be updated by the first tap coefficient updater,
wherein the tap-coefficient control circuit arranges the tap coefficients converged by the second tap coefficient updater in descending order of contribution degree to the convergence operation of tap coefficient update in the first tap coefficient updater, judges the tap coefficient not less than upper specified number to be valid and the tap coefficient less than the specified number to be invalid, and sets the tap coefficient of the first digital filter corresponding to the tap coefficient judged to be invalid to zero not to be used in a calculation of the first tap coefficient updater until a next judgment result is made.

10. An optical communication system comprising:
an optical receiver receiving an optical signal and converting the received optical signal into an electrical signal;
an AD converter converting a signal output from the optical receiver into a digital signal; and
an adaptive equalizer comprising:
an adaptive filter including a first digital filter compensating for a distortion of an input signal, and a first tap coefficient updater adaptively updating a tap coefficient of the first digital filter according to a polarization state of the input signal by a convergence operation;
a second digital filter compensating for the distortion of the input signal;
a second tap coefficient updater adaptively updating a tap coefficient of the second digital filter according to the polarization state of the input signal by a convergence operation; and
a tap-coefficient control circuit setting the tap coefficient converged by the second tap coefficient updater as an initial value of the tap coefficient in the first digital filter which is to be updated by the first tap coefficient updater, arranging the tap coefficients converged by the second tap coefficient updater in descending order of contribution degree to the convergence operation of tap coefficient update in the first tap coefficient updater, judging the tap coefficient not less than upper specified number to be valid and the tap coefficient less than the specified number to be invalid, and setting the tap coefficient of the first digital filter corresponding to the tap coefficient judged to be invalid to zero not to be used in a calculation of the first tap coefficient updater until a next judgment result is made,
the adaptive equalizer performing equalization processing that compensates for distortion of a signal output from the AD converter due to polarization fluctuation.

* * * * *